(12) United States Patent
Taori et al.

(10) Patent No.: US 6,208,274 B1
(45) Date of Patent: Mar. 27, 2001

(54) TRANSMISSION SYSTEM USING A VARIABLE LENGTH ENCODER

(75) Inventors: Rakesh Taori; Robert J. Sluijter; Andreas J. Gerrits, all of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/113,964

(22) Filed: Jul. 10, 1998

(30) Foreign Application Priority Data

Jul. 11, 1997 (EP) .................................................. 97202165

(51) Int. Cl.[7] .................................................. H03M 7/40
(52) U.S. Cl. .................................................. 341/67
(58) Field of Search .................................. 341/51, 63, 65, 341/67

(56) References Cited

U.S. PATENT DOCUMENTS

| | | | |
|---|---|---|---|
| 3,185,824 | * 5/1965 | Blasbalg et al. | 341/63 |
| 3,394,352 | * 7/1968 | Wernikoff et al. | 341/67 |
| 4,706,265 | 11/1987 | Furukawa | 375/122 |
| 5,177,480 | * 1/1993 | Clark | 341/51 |

FOREIGN PATENT DOCUMENTS

| | | |
|---|---|---|
| 63-181586 | * 7/1988 | (JP) . |
| 63-290021 | * 11/1988 | (JP) . |
| 1-012621 | * 1/1989 | (JP) . |

OTHER PUBLICATIONS

By Robert G. Gallager, Information Theory and Reliable Communication, "Coding for Discrete Sources", pp. 38–70.

* cited by examiner

Primary Examiner—Howard L. Williams

(57) ABSTRACT

In a transmission system a variable length encoder is used to reduce the average bitrate of a sequence of symbols. In order to limit the maximum length of the code it is proposed to transmit the sequence of symbols only in coded form if the length of the coded sequence is lower than a predetermined value

11 Claims, 2 Drawing Sheets

TRANSMISSION SYSTEM USING A VARIABLE LENGTH ENCODER

TECHNICAL FIELD

The present invention is related to a transmission system comprising a transmitting arrangement with a variable length encoder for encoding sequences of input symbols into variable length encoded sequences, the transmitting arrangement further comprises a transmitter for transmitting said variable length encoded sequences via a transmission medium to a receiver, the receiver comprising a variable length decoder for decoding the variable length encoded symbols into decoded sequences of symbols.

The present invention is also related to a transmitter, a receiver, a variable length encoder, a variable length decoder, a variable length encoding method, a variable length decoding method, a tangible medium comprising a computer program for executing said methods and a signal comprising variable length encoded symbols.

BACKGROUND OF THE INVENTION

A transmission system according to the preamble is known from the book Information Theory and Reliable Communication" by Robert G. Gallager, Chapter 3, Coding for Discrete Sources, pp. 38–70, ISBN 471 29048 3.

Transmission systems according to the preamble are used for transmitting sequences of symbols having unequal probabilities. Such sequences can be transmitted more efficiently by using short encoded sequences for input sequences having a high probability, and using longer encoded sequences for input sequences having a lower probability.

Examples of variable length codes are the well known Morse code and the Huffman code. In general, the use of variable length coding results in a decreased number of symbols that has to be transmitted for transporting a particular sequence of input symbols. But it is also possible that the number of symbols required to transport a particular sequence of input symbols is substantially larger than the uncoded message. This can happen if the sequence of input symbols comprises symbols having a low probability. In such a case practical problems can arise such as overflow of buffers or the impossibility to put the encoded message in a frame having only a limited space available for it.

SUMMARY OF THE INVENTION

The object of the present invention is to provide a transmission system according to the preamble in which the above mentioned problems do not occur anymore, without increasing the size of buffers or the available size in a frame.

To achieve said objective, the transmission system according to the present invention is characterized in that the transmitting arrangement is arranged for passing the sequence of input symbols to the transmitter if the combined length of a number of variable length encoded sequences exceeds a predetermined value, said number being larger or equal to one, and in that the receiver is arranged for passing a received sequence of symbols undecoded to an output if said combined length of a number of variable length encoded sequences exceeds said predetermined value.

By determining the length of the variable length encoded sequences, and by transmitting the input sequences if the length of the variable length encoded sequences exceeds a predetermined value, it is possible to limit the length of the transmitted sequence of symbols to the length of the input sequences. Therewith the length of the transmitted sequences of symbols is bounded by a predetermined value.

It is possible to determine the length of each individual sequence of variable length encoded symbols (e.g. a word) and to decide whether or not this length exceeds a predetermined value. It is also possible to determine a combined length of a plurality of variable length encoded sequences and to decide whether or not this combined length exceeds a (larger) predetermined value.

An embodiment of the invention is characterized in that said predetermined value is the combined length of the sequences of input symbols.

By making said predetermined length equal to the length of the sequence of input symbols or equal to the combined length of a plurality of input symbols, it is obtained that the length of the sequences of symbols is limited, and that it is ensured that the transmitter is always able to store or transmit its information in the available buffer or space in a transmission frame respectively.

A further embodiment of the invention is characterized in that the transmitting arrangement is arranged for transmitting an indicator indicating that at least one input sequence of symbols is transmitted instead of the corresponding variable length encoded sequence of symbols, and in that the receiver is arranged to pass a received sequence of symbols undecoded to its output or to pass a received sequence of symbols to an input of the variable length decoder.

By introducing an indicator in the transmitted signal, it becomes very easy for the receiver to decide which operation (decoding the received sequences of symbols or passing said received sequences of symbols directly to the output) it has to perform.

BRIEF DESCRIPTION OF THE DRAWING

The present invention will now be explained with reference to the drawings. Herein shows.

DETAILED DESCRIPTION

Figure 1:
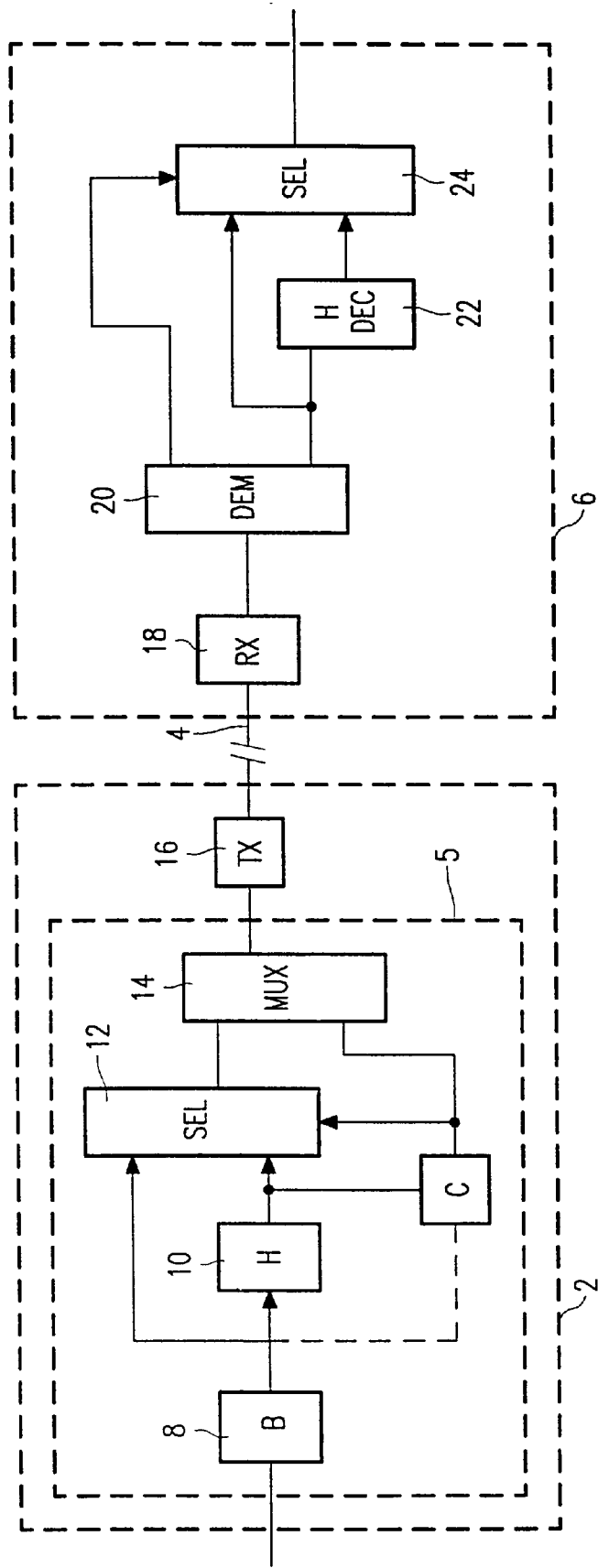
FIG. 1, a transmission system according to a first embodiment of the invention.

In the transmission system according to FIG. 1, a transmitter 2 comprises an encoder 5 for encoding sequences of input symbols. Said sequences of input symbols comprise words with a predetermined length, which can be different for subsequent words. The input words are applied to a buffer 8 in the encoder 5. The words stored in the buffer 8 are subsequently applied to a variable length encoder, which is here a Huffman encoder 10.

The Huffman encoder 10 can be realized by a lookup table which supplies the Huffman encoded word corresponding to the input word at its output. The table supplies also an indication of the length of the Huffman encoded word to its output. An example of such a lookup table is given below for a four bit input word.

| Input | Huffman code | Length | Input | Huffman code | Length |
| --- | --- | --- | --- | --- | --- |
| 0000 (0) | 110110100 | 9 | 1000 (8) | 000 | 3 |
| 0001 (1) | 11011011 | 8 | 1001 (9) | 11010 | 5 |

-continued

| Input | Huffman code | Length | Input | Huffman code | Length |
|---|---|---|---|---|---|
| 0010 (2) | 110111 | 6 | 1010 (10) | 1101100 | 7 |
| 0011 (3) | 1100 | 4 | 1011 (11) | 1101101011 | 10 |
| 0100 (4) | 111 | 3 | 1100 (12) | 110110101011 | 12 |
| 0101 (5) | 10 | 2 | 1101 (13) | 110110101010 | 12 |
| 0110 (6) | 01 | 2 | 1110 (14) | 110110101000 | 12 |
| 0111 (7) | 001 | 3 | 1111 (15) | 110110101001 | 12 |

From the above displayed table it is clear that the length of the different Huffman encoded codewords differs considerably. According to the principle of variable length encoding the shortest Huffman codes are assigned to the most probable input words. The input code word and the Huffman encoded word at the output of the Huffman encoder 10 are applied to a selector 12. The part of the output signal of the Huffman encoder representing the length of the currently Huffman encoded word is also applied to a comparator which compares this length with the predetermined value. An output signal of the comparator 10 is applied to an input of the selector 12 and a multiplexer 14. If the Huffman encoded sequence is larger than the predetermined value, the selector 12 is instructed to pass the input word of the Huffman encoder to its output. Otherwise the output signal of the Huffman encoder 10 is passed to the output of the selector 12. The output signal of the comparator 3 is included as a "Huffman indicator" in the output signal of the multiplexer 14 to enable a receiver to determine whether the received words have to be decoded or not. It is observed that the function of the Huffman encoder 10, the comparator 3 and the selector 12 can be implemented by a single table. This table is presented below.

| Input | Output code | Indicator | L | Input | Output code | Indicator | L |
|---|---|---|---|---|---|---|---|
| 0000 (0) | 0000 | 1 | 4 | 1000 (8) | 000 | 0 | 3 |
| 0001 (1) | 0001 | 1 | 4 | 1001 (9) | 1001 | 1 | 4 |
| 0010 (2) | 0010 | 1 | 4 | 1010 (10) | 1010 | 1 | 4 |
| 0011 (3) | 0011 | 1 | 4 | 1011 (11) | 1011 | 1 | 4 |
| 0100 (4) | 111 | 0 | 3 | 1100 (12) | 1100 | 1 | 4 |
| 0101 (5) | 10 | 0 | 2 | 1101 (13) | 1101 | 1 | 4 |
| 0110 (6) | 01 | 0 | 2 | 1110 (14) | 1110 | 1 | 4 |
| 0111 (7) | 001 | 0 | 3 | 1111 (15) | 1111 | 1 | 4 |

In order to inform the multiplexer 14 how many bits are to be introduced into its output signal, the length of each output word is also stored in the table. It is observed that in the presented example one table is used. However it is possible that the properties (length and probabilities) of subsequent input words differ significantly. In such a case it is required to use different coding tables for subsequent input words.

The output signal of the multiplexer 14 is applied to transmit means 16 which are arranged to transmit the output signal of the multiplexer 14 to via a transmission medium 4 to a receiver 6. The tasks of the transmit means 16 involve channel coding and modulation.

In the receiver 18, the input signal is processed by receive means 18. The operations performed by the receive means comprise amplification, demodulation and channel decoding. The demultiplexer 20 separates the "Huffman indicator" and the reconstructed output signal of the selector 12. The latter is applied to an input of a Huffman decoder 22 and to an input of a selector 24. The output signal of the Huffman decoder 22 is applied to a further input of the selector 24. Dependent on the value of the "Huffman indicator" the (undecoded) output signal of the demultiplexer 20 or the Huffman decoded output signal of the Huffman decoder is passed to the output of the selector 24.

Figure 2:
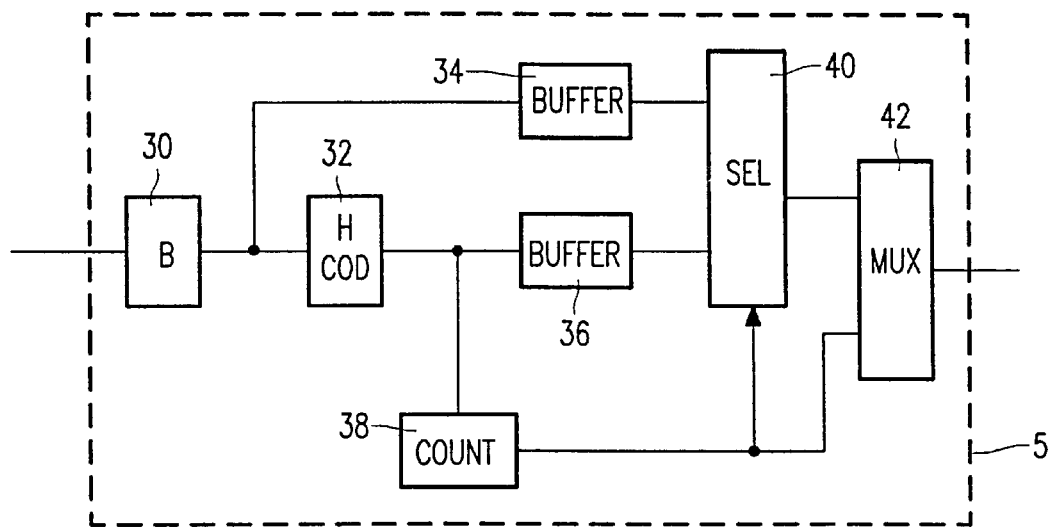
FIG. 2, an alternative embodiment of the encoder 5 for use in a transmission system according to the invention.

The encoder 5 according to FIG. 2 is arranged to compare the sum of the lengths of a plurality of Huffman encoded words with a predetermined value. This can be useful if a plurality of words have to be transmitted in a limited amount of space in a frame. By comparing said sum of lengths with a predetermined value, which can be the sum of the lengths of the uncoded words, it is possible to decide whether the plurality of words is completely transmitted as Huffman encoded words or as uncoded words.

The buffer 30 receives the input words and passes them to an input of a buffer 34 and to an input of a Huffman encoder 32. The output signal of the Huffman encoder 32 is passed to a length counter 38 and to a buffer 36. The length counter 38 counts the accumulated length of the Huffman encoded codewords over a certain number of encoded codewords. This number can e.g. be the number of codewords which can be a number of words that has to be transmitted in a frame.

If said plurality of words has been encoded, the length counter 38 compares the accumulated length with the predetermined value and decides whether the words are to be transmitted in Huffman encoded form or that they are to be transmitted in uncoded form. This decision is passed to the selector 40 and to the multiplexer 42.

The selector 40 presents, in dependence of the decision of the length counter 38, the complete set of uncoded words stored in the buffer 34 or the complete set of Huffman encoded words stored in the buffer 36 at its output. The output signal of the selector 40 multiplexed with the output signal of the length counter 38 to obtain the output signal of the encoder 5. The output signal of the length counter 38 is included in the output signal as "Huffman indicator".

Figure 3:
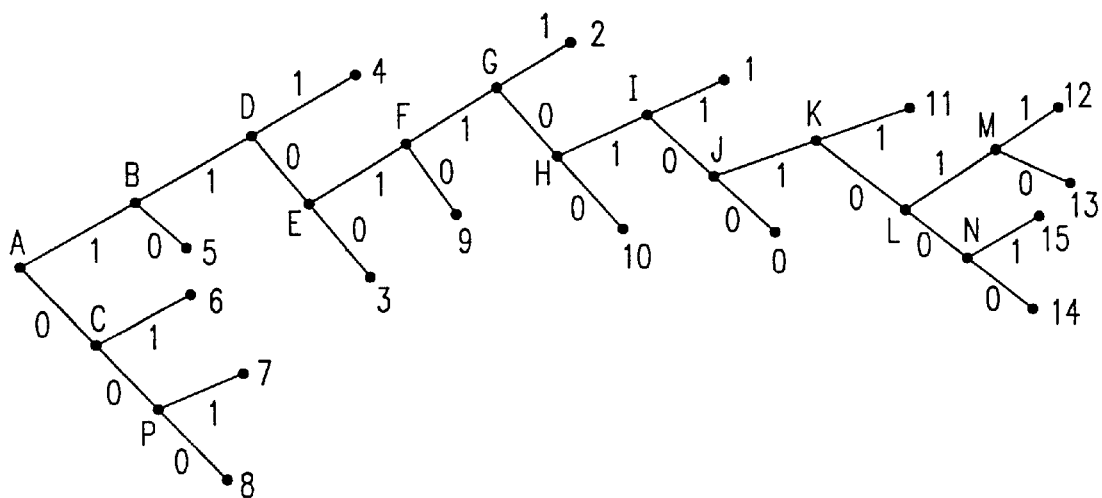
FIG. 3, a Huffman decoding tree to be used in the Huffman decoder used in the present invention.

In FIG. 3 a Huffman tree of the Huffman code as presented above is shown. The Huffman tree comprises one starting node A, a plurality of intermediate nodes B to P and a plurality of end nodes 0 to 15. Each node is stored in a data structure in which the type of node is stored. In the case of intermediate nodes also pointers to subsequent nodes are stored together with the value of the bit corresponding to a transition from said node to said subsequent nodes is stored. In the final nodes, the value of the corresponding decoded word is stored. In order to explain the decoding process the decoding of the Huffman encoded word "1101100" corresponding to the input word "1010" (decimal 10). In the decoding the Huffman encoded word is processed from left to right.

At the beginning of the decoding, the process is initialized at node A. Subsequently the first bit (being here "1") is read from the encoded word. Subsequently it is checked which subsequent node corresponds to the value of "1" of the current bit. From the information stored in the data structure representing node A, it is found that node B is the subsequent node. The pointer stored in the data structure representing node A is used to find the data structure to represent node B.

Subsequently the type of node B is checked using the information stored in the corresponding data structure. Because B is an intermediate node, the next bit (being here equal to "1") is read from the encoded word. From the information found in the data structure representing node B it is found that the subsequent node corresponding to a value "1" of the current bit is node D.

In this way the tree is traversed from node A to H via the nodes B,D,E,F and G. At node H it is established that node 10 is the subsequent node corresponding to the final bit value "0". from the data structure representing node 10, it is found that node 10 is a final node. Consequently the decoding process is stopped and the output word "1010" stored in the data structure corresponding to node 10 is presented to the output.

What is claimed is:

1. Transmission system comprising a transmitting arrangement with a variable length encoder for encoding an input symbol into a variable length encoded symbol, the input symbol being comprised in a sequence of input symbols of which subsequent symbols have different properties and the variable length encoded symbol being encoded in accordance with a property of the input symbol, the transmitting arrangement further comprising a transmitter for data via a transmission medium to a receiver, the receiver comprising a variable length decoder, the transmitting arrangement being arranged for passing the input symbol to the transmitter as the data if a length of the variable length encoded symbol exceeds a length of the input symbol, and being arranged for transmitting an indicator indicating that the input symbol is transmitted as the data instead of a corresponding variable length encoded symbol, and the receiver being arranged for passing received data undecoded to an output if the received data is passed input symbol data, and for providing the received data to the variable length decoder for decoding the received data into a decoded symbol if the received data is variable length encoded symbol data, the received data being passed unencoded to the output if the indicator has a first value, and the received data being provided to the variable length decoder if the indicator has a second value.

2. Transmission system according to claim 1, wherein the variable length encoder comprises a Huffman encoder, and the variable length decoder comprises a Huffman decoder.

3. A transmission system as claimed in claim 1, wherein the variable length encoder uses different coding tables for subsequent input symbols.

4. A transmission system as claimed in claim 3, wherein at least a number of the input symbols have different lengths.

5. Transmitting arrangement with a variable length encoder for encoding an input symbol into a variable length encoded symbol, the input symbol being comprised in a sequence of input symbols of which subsequent symbols have different properties and the variable length encoded symbol being encoded in accordance with a property of the input symbol, the transmitting arrangement further comprising a transmitter for transmitting data via a transmission medium, the transmitting arrangement being arranged for passing the input symbol to the transmitter as the data if a length the variable length encoded symbol exceeds a length of the input symbol, and being arranged for transmitting an indicator indicating that the input symbol is transmitted as the data instead of a corresponding variable length encoded symbol.

6. A transmitting arrangement as claimed in claim 5, wherein the variable length encoder uses different coding tables for subsequent input symbols.

7. A transmission system as claimed in claim 6, wherein at least a number of the input symbols have different lengths.

8. Receiver comprising a variable length decoder, the receiver being arranged for passing a received symbol unencoded to an output of the receiver if the received symbol has a first property, and for providing the received symbol to the variable length decoder for decoding the received symbol into a decoded symbol if the received symbol has a second property, the received data being passed unencoded to the output if a received indicator has a first value, and the received data being provided to the variable length decoder if the received indicator has a second value.

9. Encoding method comprising encoding an input symbol into a variable length encoded symbol, the input symbol originating from a sequence of input symbols of which subsequent symbols have different properties and the variable length encoded symbol being encoded in accordance with a property of the input symbol, passing the input symbol unencoded to an output if a length of the variable length encoded symbol exceeds a length of the input symbol, passing the variable length encoded symbol to the output if the length of the variable length encoded symbol does not exceed the length of the input symbol, and transmitting an indicator indicating that the input symbol is transmitted as the data instead of a corresponding variable length encoded symbol.

10. Decoding method for decoding a variable length encoded symbol, the method comprising passing a received symbol unencoded to an output if the received symbol has a first property, providing the received symbol to the variable length decoder for decoding the received symbol into a decoded symbol, and thereafter passing the decoded symbol to the output if the received symbol has a second property, the received data being passed unencoded to the output if a received indicator has a first value, and the received data being provided to the variable length decoder if the received indicator has a second value.

11. Signal comprising a symbol, and an indicator, the indicator indicating on a symbol by symbol basis whether the symbol is variable length encoded or, alternatively, is unencoded.

* * * * *